United States Patent [19]

Messina

[11] Patent Number: 5,309,319
[45] Date of Patent: May 3, 1994

[54] INTEGRAL COOLING SYSTEM FOR ELECTRIC COMPONENTS

[75] Inventor: Gaetano P. Messina, Hopewell Junction, N.Y.

[73] Assignee: International Business Machines Corporation, Armonk, N.Y.

[21] Appl. No.: 860,226

[22] Filed: Mar. 27, 1992

Related U.S. Application Data

[63] Continuation of Ser. No. 650,369, Feb. 4, 1991, abandoned.

[51] Int. Cl.⁵ ............................................. H05K 7/20
[52] U.S. Cl. .................................. 361/699; 165/80.4; 165/142; 257/714
[58] Field of Search ............ 357/82; 165/80.4, 104.33, 165/142, 143; 62/418; 361/382, 385–388, 400, 403, 405, 689, 699, 702, 704, 707; 257/707, 714, 720

[56] References Cited

U.S. PATENT DOCUMENTS

| | | |
|---|---|---|
| 2,917,685 | 12/1959 | Wiegand . |
| 3,365,620 | 1/1968 | Butler et al. . |
| 3,414,775 | 12/1968 | Melan et al. . |
| 3,908,188 | 9/1975 | Kawamoto . |
| 3,989,099 | 11/1976 | Hosono et al. . |
| 3,991,396 | 11/1976 | Barkan . |
| 3,993,123 | 11/1976 | Chu et al. . |
| 4,138,692 | 2/1979 | Meeker et al. . |
| 4,381,032 | 4/1983 | Cutchaw . |
| 4,688,147 | 8/1987 | Ono . |
| 4,750,086 | 6/1988 | Mittal .................................. 361/382 |
| 4,759,403 | 7/1988 | Flint et al. . |
| 4,765,397 | 8/1988 | Chrysler ........................ 165/104.33 |
| 4,765,400 | 8/1988 | Chu et al. . |
| 4,777,561 | 10/1988 | Murphy et al. . |
| 4,783,721 | 11/1988 | Yamamoto et al. . |
| 4,791,983 | 12/1988 | Nicol et al. . |
| 4,809,134 | 2/1989 | Tustaniwskyj et al. . |
| 4,940,085 | 7/1990 | Nelson ................................ 165/80.3 |

FOREIGN PATENT DOCUMENTS

| | | |
|---|---|---|
| 0151546 | 8/1985 | European Pat. Off. . |
| 0243793 | 11/1987 | European Pat. Off. . |
| 0341950 | 3/1990 | European Pat. Off. . |

OTHER PUBLICATIONS

IBM Technical Disclosure Bulletin, vol. 33, No. 1A, Jun. 1990, Armonk, N.Y. US, pp. 293–295, "Fault-Tolerant Immersion Cooling".

E. G. Loeffel et al. *IBM Technical Disclosure Bulletin*, vol. 20, No. 2, Jul. 1977, "Liquid Cooled Module With Compliant Membrane", pp. 673–674.

V. W. Antonetti et al. *IBM Technical Disclosure Bulletin*, vol. 20, No. 11A, Apr. 1978, "Integrated Module Heat Exchanger".

(List continued on next page.)

*Primary Examiner*—Gerald P. Tolin
*Attorney, Agent, or Firm*—Sughrue, Mion, Zinn, Macpeak & Seas

[57] ABSTRACT

An integral cooling system for cooling a plurality of electronic components, including: a cooling fluid manifold for mounting over the plurality of electronic components; a main fluid inflow duct within the manifold for supplying pumped cooling fluid; a main fluid outflow duct within the manifold for removing pumped cooling fluid; for each respective electronic component of the plurality of electronic components: a component cooling chamber within the manifold, for application of cooling fluid to an area immediately adjacent the electronic component; a fluid supplying duct within the manifold to supply cooling fluid from the main fluid inflow duct to the chamber; and, a fluid removing duct within the manifold to remove cooling fluid from the chamber to the main fluid outflow duct. In preferred embodiments, there is a thermally-conductive slug or piston disposed between the respective electronic component and component cooling chamber to prevent direct application of a flow of the pumped cooling fluid to the respective electronic component, and to encourage uniform cooling across the respective electronic component.

19 Claims, 2 Drawing Sheets

OTHER PUBLICATIONS

P. Hwang et al. *IBM Technical Disclosure Bulletin*, vol. 20, No. 11A, Apr. 1978, "Conduction Cooling Module", pp. 4334–4335.

C. J. Keller et al. *IBM Technical Disclosure Bulletin*, vol. 21, No. 6, Nov. 1978, "High Power Rectifier Jet–Cooled Heat Sink", p. 2438.

C. D. Ostergren, *IBM Technical Disclosure Bulletin*, vol. 27, No. 18, Jun. 1984, "Mini Conformal Cold Plate", pp. 494–495.

D. Balderes et al. *IBM Technical Disclosure Bulletin*, vol. 20, No. 11A, Apr. 1978, "Liquid Cooling of A Multichip Module Package", pp. 4336–4337.

V. W. Antonetti et al., *IBM Technical Disclosure Bulletin*, vol. 21, No. 6, Nov. 1978, "Compliant Cold Plate Cooling Scheme", p. 2431.

G. T. Galyon et al., *IBM Technical Disclosure Bulletin*, vol. 28, No. 11, Apr. 1986, "New TCM Design Using Bellows", p. 4759.

J. H. Seely, *IBM Technical Disclosure Bulletin*, vol. 11, No. 7, Dec. 1968, "Combination Cooling System", pp. 838–839.

K. S. Sachar, *IBM Technical Disclosure Bulletin*, vol. 20, No. 9, Feb. 1978, "Liquid Jet Cooling of Integrated Circuit Chips", pp. 3727–3728.

A. H. Johnson, *IBM Technical Disclosure Bulletin*, vol. 20, No. 10, Mar. 1978, "Device Cooling", p. 3919.

J. C. Eid et al., *IBM Technical Disclosure Bulletin*, vol. 29, No. 12, May 1987, "Circuit Module With Evaporative Cooling From Sintered Coating On Pistons", pp. 5195–5196.

Edmund L. Andrews, Business Technology, "For Chips That Overheat: A Tiny Radiator" (*New York Times*, Wednesday, Sep. 20, 1989).

M. E. Ecker, *IBM Technical Disclosure Bulletin*, vol. 10, No. 7, Dec. 1967, "Interface For Thermal Exchange Devices", p. 943.

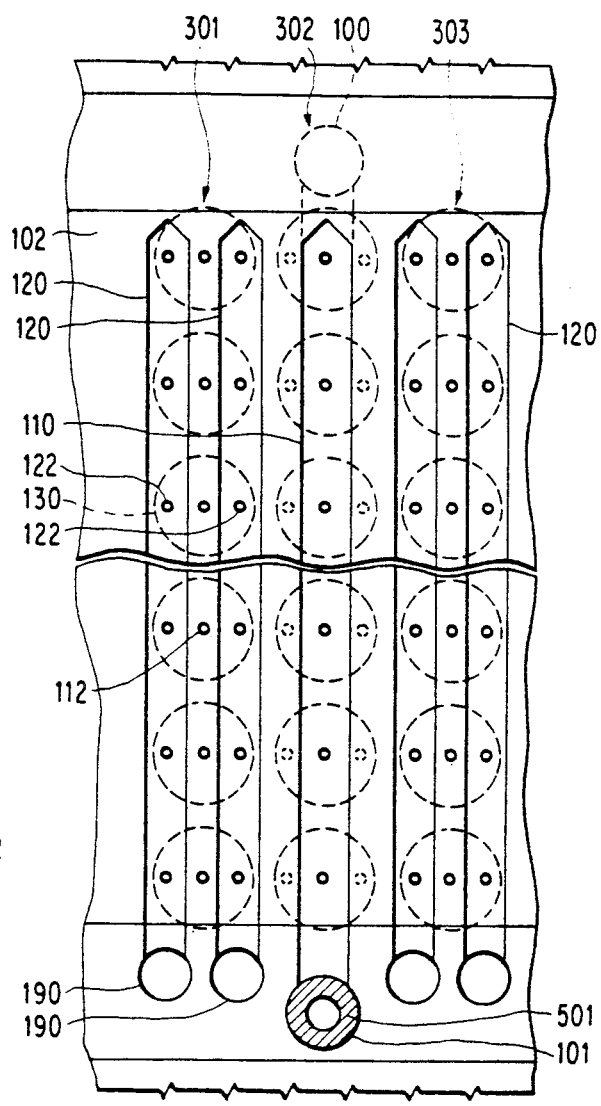
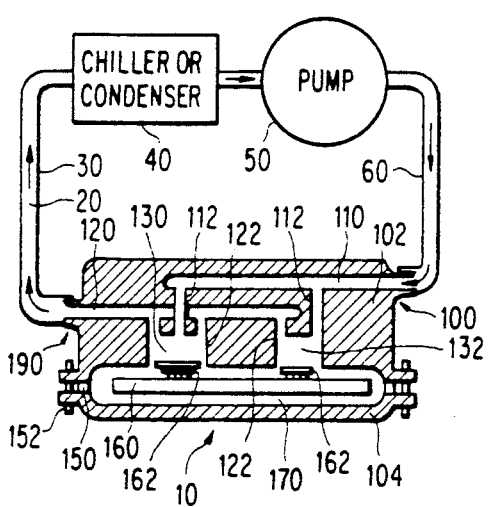
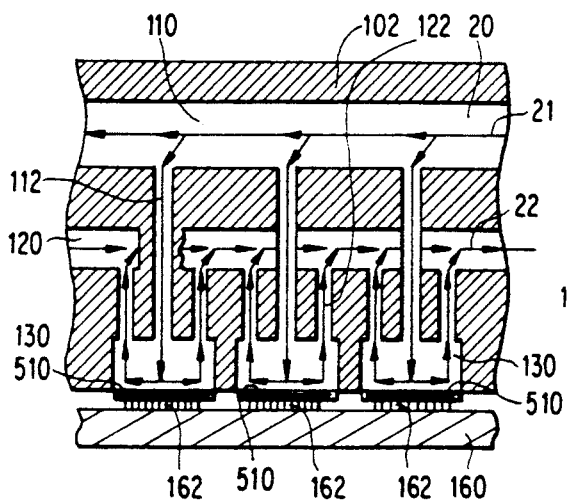
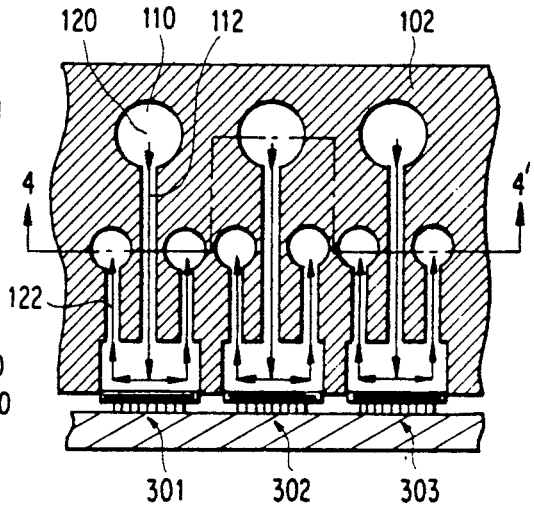

FIG. 5
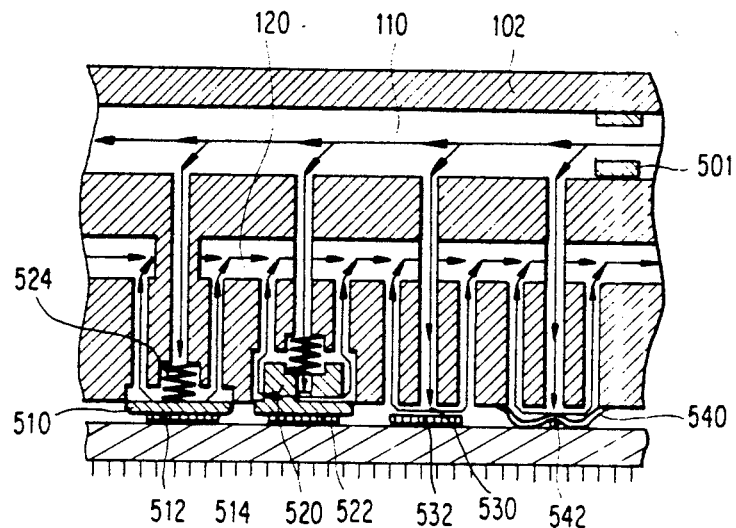
FIG. 6a 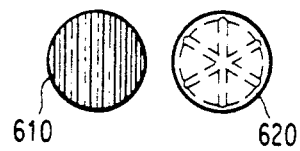 FIG. 6b
FIG. 7
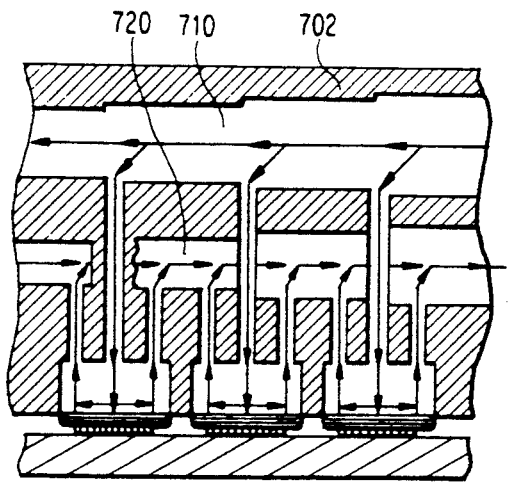
FIG. 8
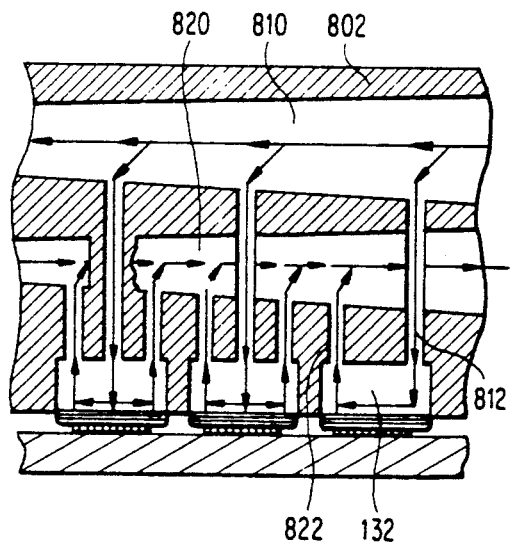

INTEGRAL COOLING SYSTEM FOR ELECTRIC COMPONENTS

This is a continuation of application No. 07/650,369 filed Feb. 4, 1991, now abandoned.

FIELD OF THE INVENTION

The subject invention is directed to an integral cooling system for cooling electronic components.

BACKGROUND OF THE INVENTION

Numerous cooling systems for cooling electronic components are known in the art. Known systems which include a "hat" type of arrangement and/or intermediary thermal conduction components between a cooling medium and an electronic component to be cooled, include:

Kawamoto (U.S. Pat. No. 3,908,188)
Hosono, et al. (U.S. Pat. No. 3,989,099)
Chu et al. (U.S. Pat. No. 3,993,123; assigned to the same assignee, IBM, as the present application)
Flint et al. (U.S. Pat. No. 4,759,403; assigned to the same assignee, IBM, as the present application)
Chu et al. (U.S. Pat. No. 4,765,400; assigned to the same assignee, IBM, as the present application) E. G. Loeffel, S. W. Nutter and A. W. Rzant, *IBM Technical Disclosure Bulletin*, Vol. 20, No. 2, July 1977, "Liquid Cooled Module With Compliant Membrane", p. 673-674
V. W. Antonetti, H. E. Liberman and R. E. Simons, *IBM Technical Disclosure Bulletin*, Vol. 20, No. 11A, April 1978, "Integrated Module Heat Exchanger"
P. Hwang, S. Oktay, A. L. Pascuzzo and A. C. Wong, *IBM Technical Disclosure Bulletin*, Vol. 20, No. 11A, April 1978, "Conduction Cooling Module", p. 4334-4335
C. J. Keller and K. P. Moran, *IBM Technical Disclosure Bulletin*, Vol. 21, No. 6, November 1978, "High-Power Rectifier Jet-Cooled Heat Sink", p. 2438
C. D. Ostergren, *IBM Technical Disclosure Bulletin*, Vol 27, No. 1B, June 1984, "Mini Conformal Cold Plate", p. 494-495

The above and other systems including a "hat" arrangement and/or intermediary thermal conduction components are disadvantageous in that thermal resistance of the system is increased and thermal transfer efficiency decreased.

Known systems which include complex "bellows" types of arrangements, and/or complex arrangements of discrete assembled parts, include:

Meeker et al. (U.S. Pat. No. 4,138,692; assigned to the same assignee, IBM, as the present application)
Ono (U.S. Pat. No. 4,688,147)
Mittal (U.S. Pat. No. 4,750,086)
Yamamoto et al. (U.S. Pat. No. 4,783,721)
Nicol et al. (U.S. Pat. No. 4,791,983)
Tustaniwskyj et al. (U.S. Pat. No. 4,809,134)
Yamamoto et al. (European Patent No. 0 151 546 A2)
D. Balderes and J. R. Lynch, *IBM Technical Disclosure Bulletin*. Vol. 20, No. 11A, April 1978, "Liquid Cooling of A Multichip Module Package", p. 4336-4337
V. W. Antonetti, R. C. Chu, K. P. Moran and R. E. Simons, *IBM Technical Disclosure Bulletin*, Vol. 21, No. 6, November 1978, "Compliant Cold Plate Cooling Scheme", p. 2431
G. T. Galyon and P. Singh, *IBM Technical Disclosure Bulletin*, Vol. 28, No. 11, April 1986, "New TCM Design Using Bellows", p. 4759

The above and other systems including complex "bellows" types of arrangements, and/or complex arrangements of discrete assembled parts are disadvantageous in that both manufacturing complexity and cost are increased, and alignment problems are prevalent.

Further known approaches include:

Wiegand (U.S. Pat. No. 2,917,685)
Butler et al. (U.S. Pat. No. 3,365,620; assigned to the same assignee, IBM, as the present application)
Melan et al. (U.S. Pat. No. 3,414,775; assigned to the same assignee, IBM, as the present application)
Barkan (U.S. Pat. No. 3,991,396)
Cutchaw (U.S. Pat. No. 4,381,032)
Murphy et al. (U.S. Pat. No. 4,777,561)
M. E. Ecker, *IBM Technical Disclosure Bulletin*, Vol. 10, No. 7, December 1967, "Interface for Thermal Exchange Devices", p. 943
J. H. Seely, *IBM Technical Disclosure Bulletin*, Vol. 11, No. 7, December 1968, "Combination Cooling System", p. 838-839
K. S. Sachar, *IBM Technical Disclosure Bulletin*, Vol. 20, No. 9, February 1978, "Liquid Jet Cooling of Integrated Circuit Chips", p. 3727-3728
A. H. Johnson, *IBM Technical Disclosure Bulletin*, Vol. 20, No. 10, March 1978, "Device Cooling", p. 3919
J. C. Eid and M. L. Zumbrunnen, *IBM Technical Disclosure Bulletin*, Vol. 29, No. 12, May 1987, "Circuit Module With Evaporative Cooling From Sintered Coating On Pistons", p. 5195-5196
Edmund L. Andrews, Business Technology, "For Chips That Overheat: A Tiny Radiator" (New York Times, Wednesday, Sep. 20, 1989)

Any "essential material" not contained in the present disclosure, but contained in any above- or below-cited U.S. patents or allowed U.S. patent applications, is incorporated herein by reference. Any "non-essential material" not contained in the present disclosure, but contained in any above- or below-cited U.S., foreign or regional patent publications, prior-filed, commonly-owned U.S. applications, or non-patent publications, is incorporated herein by reference.

With the advent of ever increasing computation speeds of computers, VLSI (Very Large Scale Integration) circuit densities have increased proportionately to satisfy demand in the market place. However, increased VLSI circuit densities and chip densities increase power dissipation requirements to enormous levels. For example, typical current semiconductor chip programs are expected to require power dissipation capability in excess of 70 watts. Estimates for future semiconductor chip programs reach 90-100 watts. The increase in chip power is taking place without any increase in chip area, and in fact, it is expected that chip areas will be decreased slightly due to recent developments in VLSI technologies. All of the above developments are necessary to enhance computer machine computational speeds, but place very aggressive design requirements on electronic component cooling schemes.

Air cooling is no longer a viable method for satisfying such high power dissipation requirements. Further, none of the approaches disclosed in the above-mentioned references can provide high power dissipation, while at the same time being low in manufacturing cost and complexity, and provide accurate and easy alignment to respective discrete electronic components which are to be cooled.

SUMMARY OF THE INVENTION

The present invention is directed toward addressing the foregoing deficiencies in the art by providing a cooling system high in power dissipation, low in manufacturing cost and complexity, and providing accurate and easy alignment to electronic components to be cooled.

All of the above objectives are accomplished by an integral cooling system for cooling a plurality of electronic components, the system comprising: a cooling liquid manifold for mounting over the plurality of electronic components; a main liquid inflow duct within the manifold for supplying pumped cooling liquid; a main liquid outflow duct within the manifold for removing pumped cooling liquid; for each respective electronic component of the plurality of electronic components: a component cooling chamber within the manifold, for application of cooling liquid to an area immediately adjacent the electronic component; a liquid supplying duct within the manifold to supply cooling liquid from the main fluid inflow duct to the chamber; and a liquid removing duct within the manifold to remove cooling liquid from the chamber to the main liquid outflow duct.

In a preferred embodiment, there is a thermally-conductive slug disposed between the respective electronic component and component cooling chamber to prevent direct application of a flow of the pumped cooling liquid to the respective electronic component, and to encourage uniform cooling across the respective electronic component. A seal can be provided between the manifold and slug to maintain the cooling liquid within the cooling chamber and prevent the cooling liquid from directly contacting the respective electronic component. Further, the slug can comprise one of a star-shaped and grooved pattern to encourage a predetermined flow of the cooling liquid across the slug.

In another preferred embodiment, the slug is replaced with a piston within the cooling chamber, which is biased to maintain contact between the piston and respective electronic component.

The slug or piston can each have at least one of a predetermined thickness and predetermined material conductivity property to provide a predetermined power dissipation capability.

In a direct cooling embodiment, the liquid supplying duct comprises a duct portion for directing a flow of the pumped cooling liquid into direct contact with the respective electronic component.

A plurality of component cooling chambers are arranged along respective lengths of the main liquid inflow duct and main fluid outflow duct, and respective liquid supplying duct and fluid removing ducts are arranged such that supplied liquid is supplied in parallel to the component cooling chambers and the pumping pressure resistance across the main liquid inflow and outflow ducts is maintained low.

In another preferred embodiment, the main liquid inflow duct has a longitudinal cross-section that is either tapered or stepped, decreasing in cross-section in a direction in which the main fluid inflow duct is required to carry cooling liquid to the component cooling chambers along the main liquid inflow duct. The main liquid outflow duct has a longitudinal cross-section which is one of tapered or stepped, increasing in cross-section in a direction in which the main fluid outflow duct is required to carry cumulative volumes of cooling liquid from component cooling chambers along the main liquid outflow duct.

At least one of the main liquid inflow duct, main liquid outflow duct, component cooling chamber, liquid supplying duct and liquid removing duct comprises a flow control arrangement for defining a volume of cooling liquid applied to the electronic components.

Finally, in a preferred embodiment, the manifold is substantially a metallic one-piece manifold, made of a substantially homogenous material, in which at least one of a casting, drilling, milling, planing and etching operation has been used to define main liquid inflow ducts, main liquid outflow ducts, component cooling chambers, liquid supplying ducts, and liquid removing ducts.

BRIEF DESCRIPTION OF THE DRAWINGS

FIG. 1 is a partial schematic, partial cutaway view of an integral cooling system according to the present invention.

FIG. 2 is a partial cutaway view of the cooling liquid manifold of the present invention.

FIG. 3 is a further partial cutaway view of the cooling liquid manifold of the present invention.

FIG. 4 is a partial top view taken along a line 4-4' of the cooling liquid manifold of FIG. 3.

FIG. 5 is another partial cutaway view of the cooling liquid manifold of the present invention, illustrating a variety of possible component cooling chamber arrangements.

FIGS. 6a and 6b are top views illustrating possible groove pattern arrangements for a top of a slug or piston.

FIG. 7 is a partial cutaway view of the cooling liquid manifold of the present invention, and having stepped main liquid inflow and outflow ducts.

FIG. 8 is a partial cutaway view of the cooling liquid manifold of the present invention, and having tapered main liquid inflow and outflow ducts.

DETAILED DESCRIPTION OF THE PREFERRED EMBODIMENTS OF THE INVENTION

Throughout the several drawings, like components will be designated with like reference numerals, and redundant discussion of the same will be omitted.

Turning now to a detailed description of the preferred embodiments of the invention, in FIG. 1, a substrate or printed circuit board 160 contains electronic components 162 which require intense power dissipation in the range of 75 watts to 120+ watts. Such intense power dissipation requirements cannot be satisfied using air-cooling arrangements, but instead are satisfied using the present unique and novel, liquid cooling arrangement.

More particularly, FIG. 1 is a partial schematic, partial cutaway view of an integral, cooling system 10 of the present invention. A cooling liquid 20 is pumped and circulated through a cooling liquid circuit consisting of an outflow return tube 30, chiller or condenser 40, pump 50, inflow supply tube 60, and cooling liquid manifold 102, 104. The outflow return tube 30, chiller or condenser 40, pump 50 and inflow supply tube 60 can each be constructed of any of numerous arrangements well known in the art, and are not further discussed as such components are not part of the inventive subject matter of the present invention. Although not illustrated, further well known liquid circuit components can also be incorporated, e.g., filters, and ion exchanger, expansion tanks, etc.

Turning now to a more detailed description of the cooling liquid manifold 102, 104 of the present invention, cooling liquid 20 within the inflow supply tube 60 is introduced into the cooling liquid manifold at single or plural input ports 100. The cooling liquid 20 travels through single or plural main liquid inflow ducts 110 within the manifold for supplying pumped cooling liquid along a longitudinal length of the manifold, and then through liquid supplying ducts 112 within the manifold to supply cooling liquid from the main liquid inflow duct 110 to component cooling chambers 130, 132.

Liquid removing ducts 122 within the manifold remove cooling liquid from the chambers 130, 132 to single or plural main liquid outflow ducts 120. The cooling liquid 20 within the main liquid outflow ducts 120 is removed from the manifold using single or plural output ports 190.

FIG. 2 is enlarged, cross-sectional view of the manifold 102, and which is more illustrative of an alternative cooling liquid flow through the manifold 102 wherein a main cooling inflow 21 and outflow 22 have opposing general directions (c.f., FIG. 1's main inflow and outflow have the same general direction). One caveat is in order with respect to FIG. 2 (and FIGS. 5, 7 and 8 discussed below), i.e., FIG. 2 (and FIGS. 5, 7 and 8) does not exactly correspond to a side view of the manifold illustrated in FIGS. 3 and 4, but is instead, a modified cutaway view meant to be illustrative of a parallel inflow and outflow of cooling liquid to a row of chambers disposed along longitudinal lengths of respective main liquid inflow and outflow ducts 110, 120.

More particularly, a main inflow 21 of a cooling liquid 20 is illustrated as dividing into subflows entering the fluid supplying ducts 112 to provide cooling liquid in parallel to at least three chambers 130. After traveling through the component cooling chambers 130, the cooling fluid traveling in parallel through the liquid removing ducts 122 recombines into main outflow 22. Such parallel supplying and removing of cooling liquid to chambers disposed in a row along longitudinal lengths of respective main liquid inflow and outflow ducts 110, 120, is advantageous in that pumping pressure resistance across corresponding pairs of main liquid inflow and outflow ducts is maintained low. Further, as the cooling chambers along a row are liquid supplied in parallel rather than in series, a cumulative or increasing level of heat typical along a series liquid circuit is avoided, and there is a more even distribution of cooling liquid across the manifold. Further, a clog or malfunction within the local liquid circuit of any respective chamber will not effect liquid supply to remaining chambers along the row, and accordingly, electronic components cooled by the remaining chambers may not be thermally damaged.

FIG. 3 is an enlarged, cross-sectional end view of the manifold 102, which is more illustrative of three parallel rows 301-303 of component cooling chambers, with each row having its own main liquid inflow and outflow ducts 110, 120. FIG. 3 is further illustrative of one possible arrangement wherein a single main liquid inflow duct 110 is provided for each row and at an upper portion of the manifold 102, and wherein dual main fluid outflow ducts 120 are provided for each row at an intermediate portion of the manifold.

FIG. 4 is a partial top view taken along a line 4—4' of the cooling liquid manifold of FIG. 3, and is even more illustrative of the three parallel rows 301-303 of component cooling chambers. FIG. 4 is further illustrative of an embodiment wherein an input port 101 is disposed on the same side of the manifold 102 as output ports 190, resulting in FIG. 2's alternative cooling fluid flow through the manifold 102 wherein a main cooling inflow 21 and outflow 22 have opposing general directions. If the FIG. 4's embodiment is instead provided with an input port 100 (indicated by the dashed line in FIG. 4) disposed on a side opposite from output ports 190, the result will be FIG. 1's cooling liquid flow with main inflow and outflow having the same general direction. Accordingly, it can be seen that the direction of liquid inflow and outflow can be dictated by the placement of the input/output ports.

One of the important aspects of the present invention, which allows the present invention to provide intense (i.e., 75 watt-120+ watt) power dissipation, is the ability to provide, for each respective electronic component (of a plurality of electronic components), a component cooling chamber 130 within the manifold, for application of cooling liquid to an area immediately adjacent the electronic component. The present invention offers a variety of thermal conduction arrangements which can be disposed between the component cooling chamber 130 and the electronic component to be cooled. More particularly, FIG. 5 is partial cutaway view of the cooling liquid manifold of the present invention, illustrating a variety of possible component cooling chamber arrangements.

In the preferred arrangement illustrated with respect to the FIG. 5s left-most component cooling chamber, a thermallyconductive slug or thin metallic disk 510 is disposed as an intermediary between the component cooling chamber and the electronic component 512 which is to be cooled. Such preferred arrangement provides advantages in at least two regards. First, the thermally-conductive slug prevents direct application of a flow of the pumped cooling liquid onto the respective electronic component, thus avoiding erosion of the same. Second, such thermally-conductive slug acts to encourage uniform cooling across the respective electronic component. In a preferred embodiment, a dimensional thickness of the slug should be maintained very thin (e.g., 0.5 mm) in order to minimize thermal resistance introduced by the slug. The slug may be further spring-loaded, using a spring 514, into biased contact with the electronic component in order to enhance and guarantee the slug/component interface.

In a second arrangement illustrated with respect to the FIG. 5's second left-most component cooling chamber, a thermallyconductive piston 520 is disposed as an intermediary between the component cooling chamber and the electronic component 522 which is to be cooled. Such piston also provides the advantage of preventing direct application of a flow of the pumped cooling liquid onto the respective electronic component, and provides a further advantage wherein the piston is movable over a wide distance range into and out of the component cooling chamber, thus allowing the piston vertically to adapt to electronic components disposed at a variety of heights above the substrate. Such piston arrangement is somewhat disadvantageous, in that the thicker piston (as compared to the preferred thin slug)

represents a large thermal resistance which decreases the thermal efficiency of the energy transfer between the electronic component and the cooling liquid. The piston may likewise be spring-loaded, using a spring 524, into biased contact with the electronic component in order to enhance and guarantee the piston/component interface.

Both the slug and piston arrangements can be used to provide customized cooling to each electronic component. More particularly, a power dissipation capability provided to an electronic component can be customized by inclusion/omission of a slug/piston (omission providing direct, unprotected cooling as discussed ahead) and/or variation of the slug's/piston's thickness or material conductivity property. Such variations afford construction of intermediary thermal components having a wide range of thermal resistances, which, in turn, allow such customized power dissipation.

FIGS. 6a and 6b are top views illustrating possible groove pattern or passage arrangements for the top of a slug or piston, which groove arrangements can be used to encourage a predetermined flow of the cooling liquid across (or through) the slug or piston. More particularly, FIG. 6a illustrates a parallel groove type of arrangement 610, while FIG. 6b illustrates a star-shaped groove or passage arrangement 620. The ability to dictate groove arrangements and encourage predetermined flow patterns is important in that uniform cooling and heat transfer can be more accurately controlled. The aforementioned Yamamoto et al. (U.S. Pat. No. 4,783,721) reference contains further teachings regarding groove arrangements.

The slug and piston arrangement can further be customized to represent a sealed arrangement, or a leaky arrangement. More particularly, if water or any other type of corrosive/electrically-conductive cooling liquid is used, it is necessary to isolate the electrical components from direct contact with such cooling liquid. Such is accomplished by providing some type of seal between the manifold 102 and the slug or piston. Examples of practical seals include an O-ring, silicon, weld, etc. If the slug or piston arrangement is a leaky one purposefully allowing cooling liquid contact with the electrical components, then the cooling liquid should be a noncorrosive and electrically non-conductive liquid, e.g., fluorocarbon.

FIG. 5s third, left-most component cooling chamber is an example of a totally unsealed and unprotective arrangement, wherein pumped cooling liquid 530 is pumped directly onto an electrical component 532. Such arrangement without any protective slug or other intermediary component, represents the most thermally efficient arrangement as there is no intermediary component adding thermal resistance to degrade the component/cooling liquid heat transfer.

If a leaky slug, leaky piston or unsealed arrangement is utilized, then further provision must be made to contain the cooling liquid to an enclosed area containing the electrical components to be cooled. FIG. 1, having a leaky slug arrangement with respect to a left component cooling chamber, and an unsealed arrangement with respect to a right chamber, is illustrative of an exemplary suitable arrangement, wherein the substrate 160 is maintained between cooling liquid manifold halves 102, 104 and in a contained bath of cooling liquid 170. A seal 150 (e.g., an O-ring) maintains the liquid seal, while fastening devices 152 maintain the halves in a mutually fixed relation.

Returning to FIG. 5, a right-most component cooling chamber is illustrative of a sealed, yet terrain-adaptable arrangement wherein a flexible, yet thermally-conductive layer 540 is allowed to conform to, and maintain contact with, an irregularly shaped electronic component 542 (e.g., a resistor or capacitor). The aforementioned M. E. Ecker, *IBM Technical Disclosure Bulletin*, Vol. 10, No. 7, December 1967, "Interface for Thermal Exchange Devices", p. 943, and D. Balderes and J. R. Lynch, *IBM Technical Disclosure Bulletin*, Vol. 20, No. 11A, April 1978, "Liquid Cooling of A Multichip Module Package", p. 4336–4337 references contain teachings regarding suitable flexible thermal interfaces.

In order to further increase the efficiency of cooling liquid flow, maintain an equal pressure along the main liquid inflow and outflow ducts, and avoid any dead (i.e., non-circulating) areas within the body of cooling liquid, the main liquid inflow duct and main liquid outflow duct can each have a longitudinal cross-section which is tapered or stepped. In the embodiments of FIGS. 7 and 8, the main liquid inflow duct decreases in cross-section in a direction in which the main liquid inflow duct is required to carry cooling liquid to component cooling chambers along the main liquid inflow duct. The main liquid outflow duct increases in cross-section in a direction in which the liquid inflow duct or main liquid outflow duct is required to carry cumulative volumes of cooling liquid from component cooling chambers along the main liquid outflow duct. FIG. 7 is a partial cutaway view of the cooling liquid manifold 702 having stepped main liquid inflow 710 and outflow 720 ducts. FIG. 8 is a partial cutaway view, of the cooling liquid manifold 802 having tapered main liquid inflow 810 and outflow 820 ducts.

Several further approaches are available for customizing and controlling cooling liquid flow through the manifold 102. More particularly, as a first approach, the number or cross-sectional size of the liquid supplying ducts 112 and/or liquid removing ducts 122 can be varied to control the volume of cooling liquid flowing through a component cooling chamber. As examples, see the rightmost chamber 132 illustrated in FIGS. 1 and 8, both of which illustrate component cooling chambers having only a single liquid supplying duct 812 and a single liquid removing duct 822 (as opposed to the dual fluid removing ducts illustrated throughout the remainder of the FIGS), resulting in a lesser volume of cooling liquid flowing through the chamber 132 and applied to the corresponding electronic component. As a second approach, standard manifolds can be constructed which allow maximum anticipated possible cooling liquid flow (i.e., as staple items), and the standard manifold can be modified utilizing, for example, inserts 501 (FIGS. 4 and 5) placed within the main liquid inflow and outflow ducts 110, 120, the component cooling chamber 130, liquid supplying duct 112 and liquid removing duct 122 to restrict a cross-section, and control a volume of cooling fluid flow through the same and ultimately applied to the electronic components. Further, the cross-sectional areas of the outflow return tube 30, inflow supply tube 60 or other liquid circuit components (e.g., a variable-flow valve) coupling to the input and output ports 100, 190 can also be used to control such flow.

In a preferred embodiment, the manifold is substantially a metallic one-piece manifold, made of a substantially homogenous material, and at least one of a casting, drilling, milling, planing and etching operation is used to define the main liquid inflow ducts, main liquid outflow ducts, component cooling chambers, liquid supplying ducts and fluid removing ducts. Plastic is a less preferred material for the manifold.

What is claimed is:

1. An integral cooling system which cools a plurality of electronic components, said system comprising:
   a one-piece cooling liquid manifold mounted over said plurality of electronic components;
   a main liquid inflow duct formed unitarily within said manifold for supplying cooling liquid;
   a main liquid outflow duct formed unitarily within said manifold for removing cooling liquid;
   a plurality of component cooling chambers formed unitarily within said manifold, for application of cooling liquid separately to an area immediately adjacent each of said plurality of electronic components;
   a plurality of liquid supplying ducts formed unitarily within said manifold to supply cooling liquid from said main liquid inflow duct to each said chamber;
   a plurality of liquid removing ducts formed unitarily within said manifold to remove cooling liquid from each said chamber to said main liquid outflow duct,
   each said chamber being enclosed except for said liquid supplying duct and said liquid removing duct; and
   a thermally-conductive slug disposed between each of said electronic components and a respective one of said component cooling chambers to prevent direct application of a flow of said cooling liquid to each of said electronic components, and to encourage uniform cooling across each of said electronic components, said slug being in direct contact with the cooling liquid in each said component cooling chamber.

2. A system as claimed in claim 1, further comprising:
   a thermally-conductive slug disposed between each of said electronic components and a respective one of said component cooling chambers to prevent direct application of a flow of said cooling liquid to each of said electronic components, and to encourage uniform cooling across each of said electronic components.

3. A system as claimed in claim 2, further comprising:
   a seal between said manifold and each said slug to maintain said cooling liquid within each said cooling chamber and prevent said cooling liquid from directly contacting said each of said electronic components.

4. A system as claimed in claim 2:
   wherein each said slug has at least one of a predetermined thickness and predetermined material conductivity property to provide a predetermined power dissipation capability.

5. A system as claimed in claim 2:
   wherein each said slug is provided with channels in a star-shaped pattern to encourage a predetermined flow of said cooling liquid across each said slug.

6. A system as claimed in claim 1:
   wherein each said liquid supplying duct comprises a portion for directing a flow of said cooling liquid into direct contact with each said electronic component.

7. A system as defined in claim 1:
   wherein said plurality of component cooling chambers are arranged along respective lengths of said main liquid inflow duct and main liquid outflow duct, and each said liquid supplying duct and each said liquid removing duct is provided in an arrangement such that cooling liquid is supplied in parallel to and removed in parallel from said plurality of component cooling chambers, the arrangement further being such that a pumping pressure resistance across said main liquid inflow and outflow ducts is maintained low.

8. A system as claimed in claim 7:
   wherein said main liquid outflow duct has a longitudinal cross-section which is one of tapered or stepped, increasing in cross-section in the direction of fluid flow.

9. A system as claimed in claim 1:
   wherein at least one of said main liquid inflow duct, said main liquid outflow duct, each said component cooling chamber, each said liquid supplying duct, and each said liquid removing duct comprises a flow control arrangement for defining a volume of cooling liquid applied to said electronic components.

10. A system as claimed in claim 1:
    wherein said manifold is made of a substantially homogeneous material.

11. A system as claimed in claim 1, further comprising:
    at least one of water and a liquid fluorocarbon as said cooling liquid;
    a pump for pumping said cooling liquid; and,
    at least one of a chiller and condenser for cooling said cooling liquid.

12. A system as claimed in claim 1:
    wherein said main liquid inflow duct has a longitudinal cross-section which is one of tapered or stepped, decreasing in cross-section in the direction of fluid flow.

13. A system as claimed in claim 2:
    wherein each said slug is provided with channels in a grooved pattern to encourage a predetermined flow of said cooling liquid across each said slug.

14. An integral cooling system which cools a plurality of electronic components, said system comprising:
    a one-piece cooling liquid manifold mounted over said plurality of electronic components;
    a main liquid inflow duct formed unitarily within said manifold for supplying cooling liquid;
    a main liquid outflow duct formed unitarily within said manifold for removing cooling liquid;
    a plurality of component cooling chambers formed unitarily within said manifold, for application of cooling liquid separately to an area immediately adjacent each of said plurality of electronic components;
    a plurality of liquid supplying ducts formed unitarily within said manifold to supply cooling liquid from said main liquid duct to each said chamber;
    a plurality of liquid removing ducts formed unitarily within said manifold to remove cooling liquid from each said chamber to said main liquid outflow duct,
    each said chamber being enclosed except for said liquid supplying duct and said liquid removing duct; and
    a piston within each said cooling chamber, each said piston being biased to maintain contact between each said piston and each of said electronic components, to prevent direct application of a flow of said cooling liquid to each of said electronic components, and to encourage uniform cooling across each of said electronic components.

15. A system as claimed in claim 14, further comprising:
a seal between said manifold and each said piston to maintain said cooling liquid within each said cooling chamber and prevent said cooling liquid from directly contacting said each of said electronic components.

16. A system as claimed in claim 14:
wherein said piston has at least one of a predetermined thickness and predetermined material conductivity property to provide a predetermined power dissipation capability.

17. A system as claimed in claim 14:
wherein each said piston is provided with channels in a star-shaped pattern to encourage a predetermined flow of said cooling liquid across each said piston.

18. A system as claimed in claim 14:
wherein each said piston is provided with channels in a grooved pattern to encourage a predetermined flow of said cooling liquid across each said piston.

19. A system as claimed in claim 14, wherein said piston is movable in and out of said chamber.

* * * * *